(12) United States Patent
Yang et al.

(10) Patent No.: US 9,034,156 B2
(45) Date of Patent: May 19, 2015

(54) SPUTTERING APPARATUS

(75) Inventors: Tae-Hoon Yang, Yongin (KR); Ki-Yong Lee, Yongin (KR); Jin-Wook Seo, Yongin (KR); Byoung-Keon Park, Yongin (KR); Yun-Mo Chung, Yongin (KR); Dong-Hyun Lee, Yongin (KR); Kil-Won Lee, Yongin (KR); Jae-Wan Jung, Yongin (KR); Jong-Ryuk Park, Yongin (KR); Bo-Kyung Choi, Yongin (KR); Won-Bong Baek, Yongin (KR); Byung-Soo So, Yongin (KR); Jong-Won Hong, Yongin (KR); Min-Jae Jeong, Yongin (KR); Heung-Yeol Na, Yongin (KR); Ivan Maidanchuk, Yongin (KR); Eu-Gene Kang, Yongin (KR); Seok-Rak Chang, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 127 days.

(21) Appl. No.: 12/948,650

(22) Filed: Nov. 17, 2010

(65) Prior Publication Data

US 2011/0120859 A1 May 26, 2011

(30) Foreign Application Priority Data

Nov. 24, 2009 (KR) .......................... 10-2009-0113887

(51) Int. Cl.
*H01J 37/34* (2006.01)
*C23C 14/34* (2006.01)
*C23C 14/18* (2006.01)

(52) U.S. Cl.
CPC ........... *C23C 14/3407* (2013.01); *C23C 14/185* (2013.01); *C23C 14/34* (2013.01); *H01J 37/3417* (2013.01); *H01J 37/3435* (2013.01); *H01J 37/3438* (2013.01)
USPC ............ 204/298.23; 204/298.11; 204/298.15; 204/298.19; 204/298.2; 204/298.06; 204/298.29

(58) Field of Classification Search
CPC .............. H01J 37/3441; H01J 37/3447; H01J 37/3417; H01J 37/3435; H01J 37/3438; C23C 14/185; C23C 14/34; C23C 14/3407

USPC ............... 204/298.11, 298.15, 298.19, 298.2, 204/298.06, 298.23, 298.29
See application file for complete search history.

(56) References Cited

U.S. PATENT DOCUMENTS

| 4,931,169 A | * | 6/1990 | Scherer et al. | ........... 204/298.11 |
| 4,988,422 A | * | 1/1991 | Wirz | ........................ 204/192.15 |

(Continued)

FOREIGN PATENT DOCUMENTS

| JP | 64000263 A | 1/1989 |
| JP | 02054764 A | 2/1990 |

(Continued)

OTHER PUBLICATIONS

Machine Translation of JP 07-233471 dated Sep. 1995.*

(Continued)

*Primary Examiner* — Rodney McDonald
(74) *Attorney, Agent, or Firm* — Robert E. Bushnell, Esq.

(57) ABSTRACT

Provided is a sputtering apparatus which deposits a metal catalyst on an amorphous silicon layer at an extremely low concentration in order to crystallize amorphous silicon, and particularly minimizes non-uniformity of the metal catalyst caused by a pre-sputtering process without reducing process efficiency. This sputtering apparatus improves the uniformity of the metal catalyst deposited on the amorphous silicon layer at an extremely low concentration. The sputtering apparatus includes a process chamber having first and second regions, a metal target located inside the process chamber, a target transfer unit moving the metal target and having a first shield for controlling a traveling direction of a metal catalyst discharged from the metal target, and a substrate holder disposed in the second region to be capable of facing the metal target. A distance difference between a linear distance, which is a distance between a substrate loaded on the substrate holder and the metal target, and a length of the first shield is less than 3 cm.

13 Claims, 3 Drawing Sheets

(56) References Cited

U.S. PATENT DOCUMENTS

| | | | | |
|---|---|---|---|---|
| 6,015,594 A | * | 1/2000 | Yoshikawa | 427/398.1 |
| 6,077,403 A | * | 6/2000 | Kobayashi et al. | 204/192.12 |
| 6,296,747 B1 | * | 10/2001 | Tanaka | 204/298.07 |
| 8,512,530 B2 | * | 8/2013 | Na et al. | 204/298.29 |
| 2004/0089534 A1 | * | 5/2004 | Takahashi | 204/192.12 |
| 2004/0142230 A1 | * | 7/2004 | Katori et al. | 429/42 |

FOREIGN PATENT DOCUMENTS

| | | | |
|---|---|---|---|
| JP | 05-263228 | * | 10/1993 |
| JP | 06322534 A | | 11/1994 |
| JP | 07-233471 | * | 9/1995 |
| JP | 07-238370 | | 9/1995 |
| JP | 11001770 A | | 1/1999 |
| JP | 2000-119849 | * | 4/2000 |
| JP | 2001053288 A | | 2/2001 |
| JP | 2002141284 A | | 5/2002 |
| JP | 2004031493 A | | 1/2004 |
| JP | 2004156122 A | | 6/2004 |
| JP | 2006-137966 A | | 6/2006 |
| JP | 2006213937 A | | 8/2006 |
| KR | 2002-0005512 A | | 1/2002 |
| KR | 10-2003-0056247 | | 7/2003 |
| KR | 10-2007-0034159 | | 3/2007 |
| KR | 10-2007-0062810 | | 6/2007 |
| TW | 200946705 | | 11/2009 |

OTHER PUBLICATIONS

Japanese Office Action issued by Japanese Patent Office on Mar. 4, 2014 in connection with Japanese Patent Application No. 2010-227769 which also claims Korean Patent Application No. 20090113887 as its priority document.

* cited by examiner

SPUTTERING APPARATUS

CLAIM OF PRIORITY

This application makes reference to, incorporates the same herein, and claims all benefits accruing under 35 U.S.C. §119 from an application earlier filed in the Korean Intellectual Property Office on 24 Nov. 2009 and there duly assigned Serial No. 10-2009-0113887.

BACKGROUND OF THE INVENTION

1. Field of the Invention

An aspect of the present invention relates to a sputtering apparatus for depositing an extremely low concentration of a metal catalyst on an amorphous silicon layer in order to crystallize the amorphous silicon, and more particularly, to a sputtering apparatus capable of minimizing non-uniformity of a metal catalyst caused by a pre-sputtering process without reducing process efficiency, and thus improving uniformity of the metal catalyst deposited on an amorphous silicon layer at an extremely low concentration.

2. Description of the Related Art

Flat panel display devices have replaced cathode ray tube display devices due to characteristics such as light weight, thin thickness, and so on, and typical examples thereof include liquid crystal displays (LCDs) and organic light emitting diode (OLED) display devices. In comparison with the LCDs, the OLED display devices are excellent in brightness and viewing angle characteristics, and require no backlight, so that OLED display devices can be realized as ultra thin displays.

The OLED display devices are classified into two types, a passive matrix type and an active matrix type, according to the driving method. The active matrix type OLED display devices include a circuit using a thin film transistor (TFT).

The TFT generally includes a semiconductor layer, which has a source region, a drain region and a channel region, and gate, source and drain electrodes. The semiconductor layer may be formed of polycrystalline silicon (poly-Si) or amorphous silicon (a-Si). The poly-Si has a higher electron mobility than the a-Si. Thus, the poly-Si is mainly used for the TFT of OLED display devices.

Among the methods of crystallizing the a-Si into the poly-Si, one uses a metal. The crystallizing method using the metal involves depositing a metal catalyst on a substrate using a process such as a sputtering process of depositing a metal layer on a substrate by applying plasma to a metal target formed of a crystallization-inducing metal such as nickel, or an atomic layer deposition (ALD) process of forming an atomic layer of a crystallization-inducing metal catalyst such as nickel on a substrate using a chemical method based on a reaction gas containing the metal catalyst, and crystallizing the a-Si using the metal catalyst as a seed, thereby providing an advantage in that the a-Si can be crystallized at a relatively low temperature in a short time.

Typical sputtering apparatuses are designed to concentrate the plasma on the metal target and substrate using a magnetic assembly located at the rear of the metal target to uniformly deposit a thick layer in a short time. However, the crystallizing method using the metal degrades the characteristics of the TFT when the metal catalyst remains in the poly-Si formed by crystallizing the a-Si, and particularly, the TFT may be driven unstably when the metal catalyst remaining in the poly-Si is magnetized. Therefore, sputtering apparatuses based on the crystallizing method using the metal perform a deposition process while moving the metal target made of the metal catalyst without using the magnetic assembly to be able to prevent magnetization of the metal catalyst discharged from the crystallization-inducing metal such as nickel as well as to deposit the metal catalyst at an extremely low concentration.

In the sputtering apparatus that performs the deposition process while moving the metal target without using the magnetic assembly, when a pre-sputtering process of removing foreign materials such as $NiO_2$ attached to a surface of the metal target prior to the deposition process is performed to be able to more uniformly and stably deposit the extremely-low-concentration metal catalyst, the metal catalyst discharged from the metal target during the pre-sputtering process is deposited on an edge of the substrate, so that the uniformity of the metal catalyst deposited on the substrate can be reduced.

Further, to prevent the metal catalyst discharged from the metal target during the pre-sputtering process from being deposited on the substrate, a region where the plasma is produced is isolated during the pre-sputtering process. In this case, a separate shield is required to isolate the plasma production area. Further, it takes a predetermined time to form or remove the separate shield depending on progress of the pre-sputtering process, so that the deposition process is delayed, and thus overall process efficiency is reduced.

SUMMARY OF THE INVENTION

Aspects of the present invention provide a sputtering apparatus, which is configured to move a metal target without using a magnetic assembly in order to prevent magnetization of a metal catalyst and to deposit the metal catalyst at an extremely low concentration. The sputtering apparatus is capable of minimizing non-uniformity of the metal catalyst caused by a pre-sputtering process without reducing process efficiency, and thus improving uniformity of the metal catalyst deposited on an amorphous silicon layer at an extremely low concentration.

According to an exemplary embodiment of the present invention, a sputtering apparatus includes a process chamber having first and second regions, a metal target located inside the process chamber, a target transfer unit, and a substrate holder disposed on the second region to be capable of facing the metal target. The target transfer unit moves the metal target and has a first shield for controlling a traveling direction of a metal catalyst discharged from the metal target. A distance difference between a linear distance, which is a distance between a substrate loaded on the substrate holder and the metal target, and a length of the first shield is less than 3 cm.

The sputtering apparatus may further include a first electrode located inside the target transfer unit, and a second electrode located inside the substrate holder. A polarity of voltage applied to the second electrode may be different from a polarity of voltage applied to the first electrode.

The sputtering apparatus may further include a second shield surrounding a portion of the first and second regions. The metal target and the substrate loaded on the substrate holder are disposed in the portion of the first and second regions during a deposition process.

Additional aspects and/or advantages of the invention will be set forth in part in the description which follows and, in part, will be obvious from the description, or may be learned by practice of the invention.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
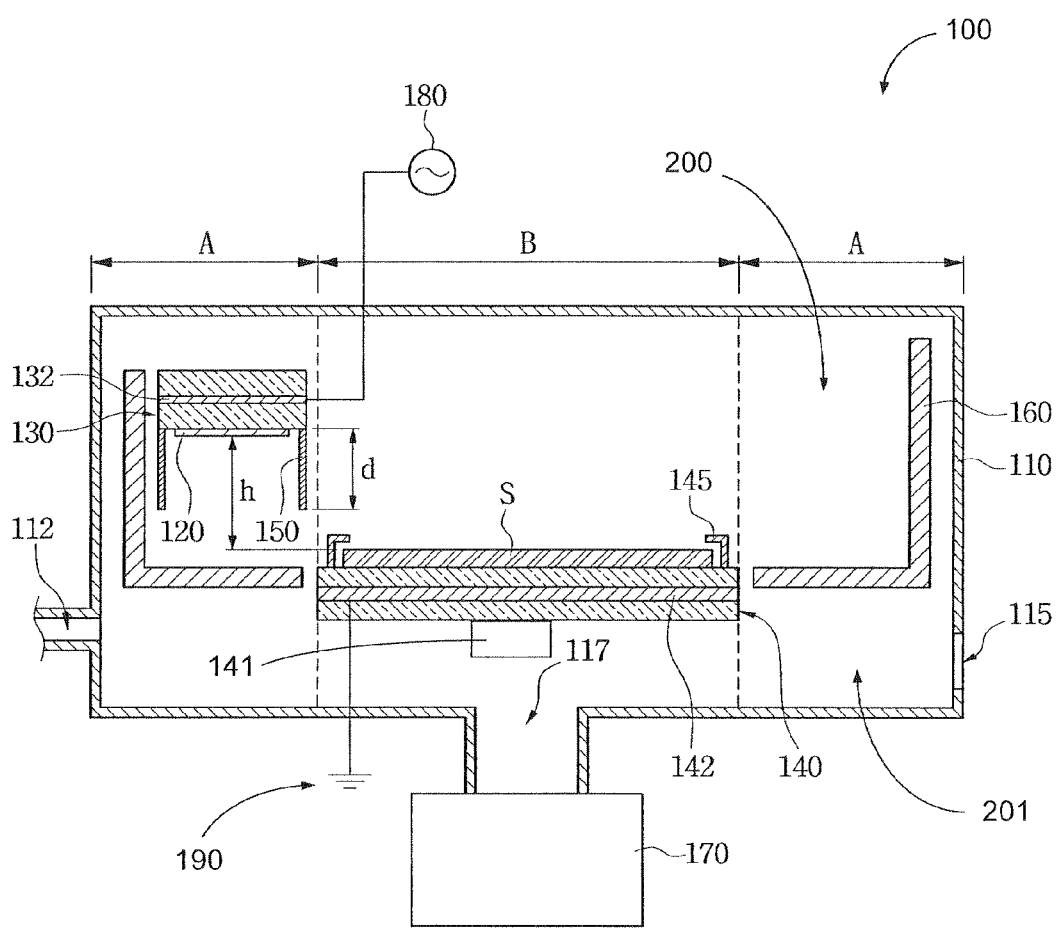
FIG. 1 is a schematic view of a sputtering apparatus according to an exemplary embodiment of the present invention.

Flat panel display devices have replaced cathode ray tube display devices due to characteristics such as light weight, thin thickness, and so on, and typical examples thereof include liquid crystal displays (LCDs) and organic light emitting diode (OLED) display devices. In comparison with the LCDs, the OLED display devices are excellent in brightness and viewing angle characteristics, and require no backlight, so that OLED display devices can be realized as ultra thin displays. The OLED display devices are classified into two types, a passive matrix type and an active matrix type, according to the driving method. The active matrix type OLED display devices include a circuit using a thin film transistor (TFT). A thin film transistor (TFT) generally includes a semiconductor layer, which includes a source region, a drain region and a channel region, and gate, source and drain electrodes. The semiconductor layer may be formed of polycrystalline silicon (poly-Si) or amorphous silicon (a-Si). The poly-Si has a higher electron mobility than the a-Si. Thus, the poly-Si is mainly used for the TFT of OLED display devices.

One of the methods of crystallizing the a-Si into the poly-Si uses a metal. The crystallizing method using the metal involves depositing a metal catalyst on a substrate using a process such as a sputtering process of depositing a metal layer on a substrate by applying plasma to a metal target formed of a crystallization-inducing metal such as nickel, or an atomic layer deposition (ALD) process of forming an atomic layer of a crystallization-inducing metal catalyst such as nickel on a substrate using a chemical method based on a reaction gas containing the metal catalyst, and crystallizing the a-Si using the metal catalyst as a seed, thereby providing an advantage in that the a-Si can be crystallized at a relatively low temperature in a short time.

Typical sputtering apparatuses are designed to concentrate the plasma on the metal target and substrate using a magnetic assembly located at the rear of the metal target to uniformly deposit a thick layer in a short time. However, the crystallizing method using the metal degrades the characteristics of the TFT when the metal catalyst remains in the poly-Si formed by crystallizing the a-Si, and particularly, the TFT may be driven unstably when the metal catalyst remaining in the poly-Si is magnetized. Therefore, sputtering apparatuses based on the crystallizing method using the metal perform a deposition process while moving the metal target made of the metal catalyst without using the magnetic assembly to be able to prevent magnetization of the metal catalyst discharged from the crystallization-inducing metal such as nickel as well as to deposit the metal catalyst at an extremely low concentration.

In the sputtering apparatus that performs the deposition process while moving the metal target without using the magnetic assembly, when a pre-sputtering process of removing foreign materials such as $NiO_2$ attached to a surface of the metal target prior to the deposition process is performed to be able to more uniformly and stably deposit the extremely-low-concentration metal catalyst, the metal catalyst discharged from the metal target during the pre-sputtering process is deposited on an edge of the substrate, so that the uniformity of the metal catalyst deposited on the substrate can be reduced.

In order to prevent the metal catalyst discharged from the metal target during the pre-sputtering process from being deposited on the substrate, a region where the plasma is produced is isolated during the pre-sputtering process. In this case, a separate shield is required to isolate the plasma production area. Further, it takes a predetermined time to form or remove the separate shield depending on progress of the pre-sputtering process, so that the deposition process is delayed, and thus overall process efficiency is reduced.

Reference will now be made in detail to the present exemplary embodiments of the present invention, examples of which are shown in the accompanying drawings, wherein like reference numerals refer to the like elements throughout. In the drawings, the thicknesses of layers and regions may be exaggerated for clarity. The exemplary embodiments are described below in order to explain the present invention by referring to the figures.

FIG. 1 is a schematic view of a sputtering apparatus according to an exemplary embodiment of the present invention.

Referring to FIG. 1, a sputtering apparatus 100 according to an exemplary embodiment of the present invention includes a process chamber 110 having a first region A where a pre-sputtering process is performed and a second region B where a deposition process is performed, a metal target 120 located in the process chamber 110, a target transfer unit 130 having a first shield 150 for controlling a traveling direction of a metal catalyst discharged from the metal target 120, and a substrate holder 140 located on the second region B of the process chamber 110 to be capable of facing the metal target 120 if the metal target 120 moves inside the second region B. A substrate S is placed on the substrate holder 140.

The process chamber 110 provides a space in which the pre-sputtering and deposition processes are performed, and further includes a gas inlet 112 supplying a reaction gas for producing plasma between the metal target 120 and the substrate holder 140, and a gas outlet 117 exhausting a residual reaction gas. The gas outflow port 117 may be configured to be connected to a vacuum pump 170 for controlling a pressure in the process chamber 110, so that the residual reaction gas can be easily exhausted without a separate exhaust pump.

Here, the reaction gas may include argon (Ar) gas that can produce plasma with low power in order to prevent damage to the substrate S loaded on the substrate holder 140.

Further, to prevent unnecessary plasma from being produced, and to prevent amorphous silicon on the substrate S from being damaged during loading or unloading by the plasma remaining in the process chamber 110, the process chamber 110 is configured such that a loading/unloading port 115 of the substrate S can be separated from the plasma production region by a second shield 160. The second shield 160 surrounds a portion of the first and second regions A and B, which is located between the metal target 120 and the substrate holder 140. The space surrounded by the second shield 160 is referred to as an inner space 200 of the second shield 160, while a space outside the inner space 200 is referred to as an outer space 201 of the second shield 160. The target 120 and the substrate S are disposed in the inner space 200 during a deposition process. In this case, the process chamber 110 may further include a holder transfer unit 141, which moves the substrate holder 140 to the loading/unloading port 115 and the second region B.

Here, the sputtering apparatus 100 according to the exemplary embodiment of the invention may be configured such that the reaction gas introduced through the gas inlet 112 of the process chamber 110 is directly fed into the inner space 200 of the second shield 160 through the second shield 160. However, since it is preferable to produce a low-density plasma in order to easily deposit the metal catalyst on the substrate at an extremely low concentration, the reaction gas introduced through the gas inlet 112 may be fed into the outer space 201 of the second shield 160, which is not surrounded by the second shield 160. In FIG. 1, the gas inlet 112 is illustrated as being located at a portion between a bottom side of the process chamber 110 and the outer surface of the second shield 160, which is in the outer space 201 of the second shield 160.

The process chamber 110 of the sputtering apparatus 100 according to the exemplary embodiment of the present invention includes a first electrode 132 located inside the target transfer unit 130 moving the metal target 120, and a second electrode 142 located inside the substrate holder 140 and connected to a power supply voltage having a polarity different from that of the first electrode 132, so that the plasma is easily produced between the metal target 120 and the substrate holder 140, but is inhibited from being produced within the first region A during the deposition process. In other words, the polarity of voltage applied to the second electrode 142 is different from the polarity of voltage applied to the first electrode 132.

Here, since the plasma produced in the process chamber 110 is dependent upon a difference in voltage between the first and second electrodes 132 and 142, the first electrode 132 may be connected to a power supply 180 supplying a constant DC voltage. The second electrode 142 may be connected to a first reference voltage source 190. Thereby, it is possible to easily control the production of the plasma.

The substrate holder 140 serves to provide a stage, on which the substrate S carried into the process chamber 110 is loaded, and may include a fixing member 145 for fixing or holding the substrate S. Here, the fixing member 145 may be configured to surround the edge of the substrate S in order to prevent the substrate S from being damaged by movement of the substrate holder 140.

The metal target 120 is designed to discharge the crystallization-inducing metal, i.e. the metal catalyst, used for the crystallizing method using metal such as nickel, to the substrate S loaded on the substrate holder 140. The metal target 120 is spaced apart from the substrate S by a predetermined linear distance h. The target transfer unit 130 serves to move the metal target 120 to the first or second region A or B, and includes a first shield 150 having a predetermined length d. As shown in FIG. 1, the length d of the first shield 150 is a distance of the first shielding extending towards the substrate S.

Here, the target transfer unit 130 may be configured such that the metal target 120 is located on the first region A before the deposition process to allow the pre-sputtering process to be carried out, and such that the metal target 120 is located on the second region B during the deposition process to allow the metal catalyst to be deposited on the substrate S. Furthermore, the target transfer unit 130 may be configured such that the metal target 120 reciprocates in the second region B during the deposition process to allow the metal catalyst to be deposited on the substrate S at an extremely low concentration.

Typically, assuming that a point source is located at a position where it is spaced apart from the substrate by the predetermined linear distance h, an amount of metal catalyst atomic beam, which is discharged from the point at which source is deposited on each position of the substrate, is calculated by Equation 1 below according to the law of cosines.

$$I = \frac{N_A}{(2\pi MRT)^{\frac{1}{2}}} \frac{pA}{\pi h^2} \cos\theta \qquad \text{Equation 1}$$

where $N_A$ is Avogadro constant, T is an absolute temperature, R is a gas constant, p is pressure of the chamber, A is a sputtering constant that is dependent on sputtering capability, θ is a depositing angle, and M is the molecular weight of the evaporated metal catalyst.

In the sputtering apparatus in which the pre-sputtering process and the deposition process are sequentially performed, under the assumption that the amount of the metal catalyst discharged from the metal target is constant for a processing time and that an adhesive strength with which the metal catalyst is attached to the substrate is ideal, the amount of the metal catalyst sprayed on the substrate is calculated using Equation 1 above while the metal target having a predetermined width is being reciprocated above the substrate by the target transfer unit. In this case, the non-uniformity of the metal catalyst deposited on the substrate is as shown in FIG. 2.

Figure 2:
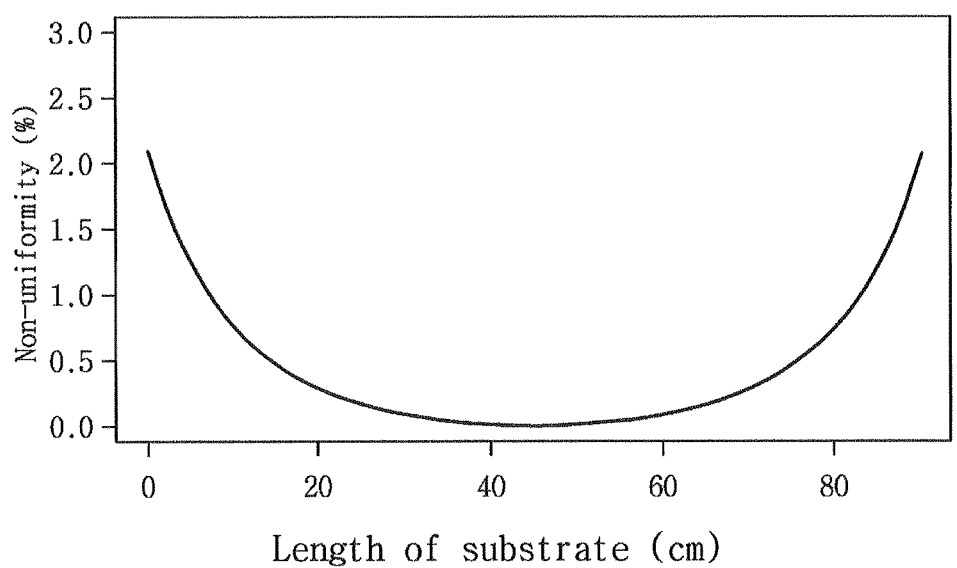
FIG. 2 is a graph showing deposition non-uniformity of a substrate when a metal target is displaced and then a deposition process is performed without providing a first shield to a target transfer unit.

Referring to FIG. 2, it can be seen that the metal catalyst deposited on the substrate is non-uniformly deposited on the edge of the substrate, i.e. at positions where the deposition process is initiated and terminated, and that the non-uniformity of the metal catalyst is about 2%.

Here, the graph of FIG. 2 shows the non-uniformity of the metal catalyst deposited on the substrate when the pre-sputtering and deposition processes are performed in a most ideal environment. It can be seen from FIG. 2 that, when the first shield for controlling a traveling direction of the metal catalyst discharged from the metal target is not provided, the non-uniformity of the metal catalyst deposited on the substrate may be less than 2%.

Figure 3:
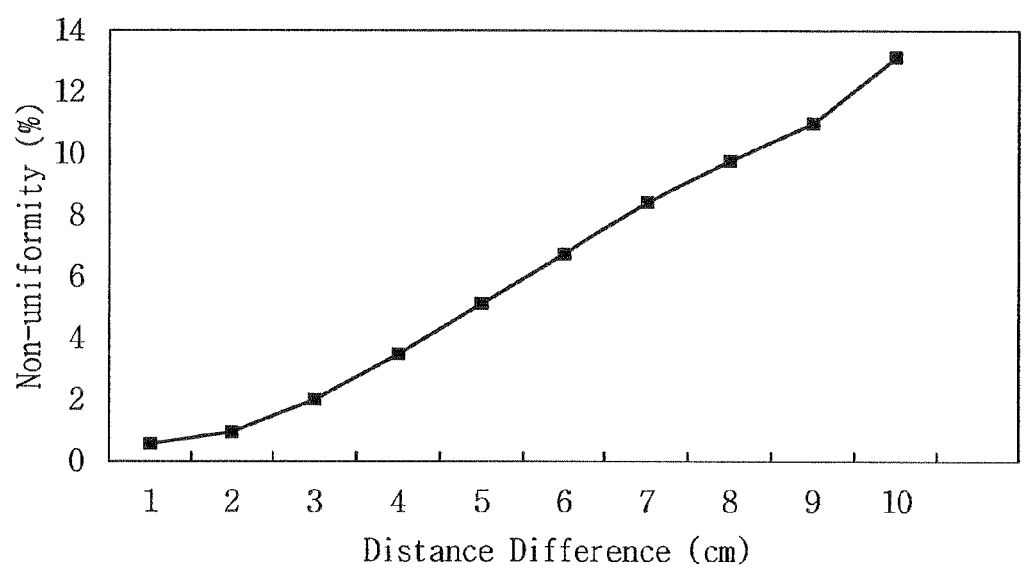
FIG. 3 is a graph showing non-uniformity of a metal catalyst deposited on a substrate depending on a difference between a linear distance between the substrate and a metal target and a length of a first shield in a sputtering apparatus according to an exemplary embodiment of the present invention.

FIG. 3 is a graph showing the non-uniformity of the metal catalyst deposited on the substrate as a function of a distance difference between a linear distance h and a length d of the first shield 150 in the sputtering apparatus according to an exemplary embodiment of the present invention.

Referring to FIG. 3, it can be seen that as the distance difference between the linear distance h and the length d of the first shield 150 becomes smaller, the non-uniformity of the metal catalyst deposited on the substrate S becomes lower. In particular, when the distance difference between the linear distance h and the length d of the first shield 150 is less than 3 cm, the non-uniformity of the metal catalyst is less than 2%.

Consequently, the sputtering apparatus according to the exemplary embodiment of the present invention is configured such that the first shield for controlling the traveling direction of the metal catalyst discharged from the metal target is provided to the target transfer unit for moving the metal target, and such that distance difference between the linear distance h and the length d of the first shield is less than 3 cm. Thereby, the non-uniformity of the metal catalyst deposited on the substrate is less than 2%, i.e. the uniformity is higher than the maximum that can be obtained when the deposition process is performed without the first shield.

Thus, in a sputtering apparatus according to exemplary embodiments of the present invention, a process chamber is divided into a region for a pre-sputtering process and a region for a deposition process, a metal target moves to the pre-sputtering region and the deposition region to sequentially perform the pre-sputtering and deposition processes, forms a first shield, which controls a traveling direction of a metal catalyst discharged from the metal target, on a target transfer unit moving the metal target, and has a difference of 3 cm or less between a linear distance h and a length d of the first shield, so that it can improve uniformity of the metal catalyst deposited on the substrate at an extremely low concentration without reducing efficiency of the entire deposition process.

Although a few exemplary embodiments of the present invention have been shown and described, it would be appreciated by those skilled in the art that changes may be made in this exemplary embodiment without departing from the principles and spirit of the invention, the scope of which is defined in the claims and their equivalents.

What is claimed is:

1. A sputtering apparatus comprising:
   a process chamber having at least two first regions and a second region, the first regions being regions in which a pre-sputtering process is performed, the second region being a region in which a deposition process is performed, the second region located in a center region of the process chamber and being disposed between the at least two first regions;
   a metal target located inside the process chamber;
   a target transfer unit moving the metal target between one of the first regions and the second region and having a first shield for controlling a traveling direction of a metal catalyst discharged from the metal target, the metal target being disposed in a space surrounded by the first shield;
   a substrate holder disposed in the second region to be capable of facing the metal target, a distance difference between a linear distance, which is a distance between a substrate loaded on the substrate holder and the metal target, and a length of the first shield being 3 cm or less;
   a loading/unloading port carrying the substrate into and out of the process chamber;
   a second shield disposed in the first regions, the second shield surrounding a space between the metal target and the substrate holder, the second shield disposed between the loading/unloading port and the space between the metal target and the substrate holder;
   a first electrode located inside the target transfer unit; and
   a second electrode located inside the substrate holder, a polarity of voltage applied to the second electrode being different from a polarity of voltage applied to the first electrode.

2. The sputtering apparatus according to claim 1, wherein the first electrode is connected to a power supply supplying predetermined power, and the second electrode is connected to a reference voltage source.

3. The sputtering apparatus according to claim 1, wherein the second shield surrounding a portion of the first and second regions, the metal target and the substrate loaded on the substrate holder is disposed in the second region during the deposition process.

4. The sputtering apparatus according to claim 3, further comprising:
   a holder transfer unit moving the substrate holder to the loading/unloading port and the second region of the process chamber.

5. The sputtering apparatus according to claim 4, wherein the loading/unloading port is disposed in an outside of the portion of the first and second regions.

6. The sputtering apparatus according to claim 3, further comprising a gas inlet introducing the reaction gas into an outside of the portion of the first and second regions for producing plasma.

7. The sputtering apparatus according to claim 6, wherein the reaction gas includes argon gas.

8. The sputtering apparatus according to claim 1, further comprising a fixing member located on one side of the substrate holder and holding the substrate.

9. The sputtering apparatus according to claim 1, wherein the metal target includes nickel.

10. The sputtering apparatus according to claim 1, wherein the target transfer unit is configured such that the metal target is reciprocated within the second region during the deposition process.

11. The sputtering apparatus according to claim 1, further comprising a vacuum pump connected to a gas outlet of the process chamber.

12. The sputtering apparatus according to claim 1, wherein a reaction gas for producing plasma between the metal target and the substrate holder is supplied only from a region outside the space surrounded by the first shield.

13. The sputtering apparatus according to claim 1, wherein the second shield covers the space surrounded by the first shield when the metal target is in one of the first regions.

* * * * *